(12) United States Patent
Lee

(10) Patent No.: US 6,842,089 B2
(45) Date of Patent: Jan. 11, 2005

(54) FILM BULK ACOUSTIC RESONATOR (FBAR) DEVICE

(75) Inventor: Joo Ho Lee, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 28 days.

(21) Appl. No.: 10/327,929

(22) Filed: Dec. 26, 2002

(65) Prior Publication Data

US 2003/0218518 A1 Nov. 27, 2003

(30) Foreign Application Priority Data

May 21, 2002 (KR) ........................................ 2002-28142

(51) Int. Cl.[7] .............................................. H03H 9/56
(52) U.S. Cl. ...................... 333/189; 333/191; 310/324; 310/349
(58) Field of Search ................................ 333/193–196, 333/133; 310/324, 349

(56) References Cited

U.S. PATENT DOCUMENTS

| | | | | |
|---|---|---|---|---|
| 5,873,153 A | * | 2/1999 | Ruby et al. ................. | 29/25.35 |
| 5,910,756 A | * | 6/1999 | Ella ........................... | 333/133 |
| 6,051,907 A | * | 4/2000 | Ylilammi .................... | 310/312 |
| 6,107,721 A | * | 8/2000 | Lakin ......................... | 310/321 |
| 6,262,637 B1 | | 7/2001 | Bradley et al. ............. | 333/133 |
| 6,355,498 B1 | * | 3/2002 | Chan et al. ................. | 438/48 |
| 6,693,500 B2 | * | 2/2004 | Yang et al. ................. | 333/189 |

OTHER PUBLICATIONS

"Thin Film Bulk Acoustic Wave Filters for GPS" by K.M. Lakin et al., IEEE Ultrasonic Symposium, 1992, pp. 471–476.

* cited by examiner

Primary Examiner—Barbara Summons
(74) Attorney, Agent, or Firm—Lowe Hauptman Gilman & Berner LLP

(57) ABSTRACT

Disclosed are a film bulk acoustic resonator (FBAR) device and a method for fabricating the film bulk acoustic resonator (FBAR) device. The film bulk acoustic resonator (FBAR) device comprises a membrane layer having a plurality of active regions and provides different resonant frequencies by providing different thicknesses of the active regions of series resonators and shunt resonators, and by controlling the thicknesses, respectively. A plurality of the film bulk acoustic resonator (FBAR) devices having different resonant frequencies are manufactured on a substrate, thereby simultaneously manufacturing a transmission filter and a reception filter on the same substrate. Further, the film bulk acoustic resonator (FBAR) device has a stable structure and excellent characteristics.

7 Claims, 9 Drawing Sheets

FILM BULK ACOUSTIC RESONATOR (FBAR) DEVICE

BACKGROUND OF THE INVENTION

1. Field of the Invention

The present invention relates to a film bulk acoustic resonator (FBAR) device and a method for fabricating the film bulk acoustic resonator (FBAR) device, and more particularly to a film bulk acoustic resonator (FBAR) device which comprises a membrane layer having a plurality of active regions and provides different resonant frequencies by providing different thicknesses of the active regions of series resonators and shunt resonators and by controlling the thicknesses, respectively, and a method for fabricating the film bulk acoustic resonator (FBAR) device.

2. Description of the Related Art

Recently, components for a mobile communication terminal such as radio frequency (RF) components have been developed to satisfy the trends of miniaturization and high-functionality of mobile communication terminals. Among the radio frequency (RF) components for mobile communication terminals, a filter is an essential component and serves to select a desired signal from many sky waves or to filter specific signals.

Particularly, as usable frequency bands of the mobile communication terminal increase, super high frequency (SHF) devices are required more and more. However, with the super high frequency (SHF) devices, it is difficult to satisfy the miniaturization and the low-cost trend required in mobile communication terminals. For example, a resonator or a filter which is operated at a frequency of more than 1 GHz has a large size, thereby not being integrated. Further, a dielectric resonator is replaced with a crystal resonator or a surface acoustic resonator. However, the crystal resonator and the surface acoustic resonator increase an insertion loss and cannot accomplish integration, miniaturization, and low cost.

In order to solve the aforementioned problems, a film bulk acoustic wave resonator ("FBAR", or may be referred to as a thin film resonator "TFR") using the resonance of a piezoelectric layer, has been developed and is now practically used.

Conventionally, the film bulk acoustic wave resonator (FBAR) device is a thin film type device, in which a thin film made of piezoelectric material such as ZnO or AlN is formed on a semiconductor substrate made of silicon or GaAs, thereby inducing resonance by piezoelectricity of the thin film. The film bulk acoustic wave resonator (FBAR) device is low-priced, miniaturized, and has a high quality. The film bulk acoustic wave resonator (FBAR) device can be used in radio communication equipment at various frequency bands (900 MHz~10 GHz) and military radar. Further, the film bulk acoustic wave resonator (FBAR) device can be microminiaturized to have a size less than one hundredth of that of a dielectric filter or a lumped constant (LC) filter, and has an insertion loss less than that of a surface acoustic wave device.

FIG. 1a is a circuit diagram of a conventional film bulk acoustic resonator (FBAR) device for a thin film filter, and FIG. 1b is a graph of the conventional film bulk acoustic resonator (FBAR) device for the thin film filter. FIG. 1a shows the ladder type conventional film bulk acoustic resonator (FBAR) device comprising a series resonator 11 and a shunt resonator 12 connected to the series resonator 11. That is, a film bulk acoustic resonator (FBAR) filter is fabricated by the composition of the series resonator 11 and the shunt resonator 12. Herein, different resonant frequencies of the series resonator 11 and the shunt resonator 12 are determined by the total thickness of a stack structure of the resonator including a piezoelectric layer. The difference of center frequencies between the series resonator 11 and the shunt resonator 12 is obtained by the difference of thicknesses of upper surfaces of the series resonator 11 and the shunt resonator 12. Herein, the stack structure of the resonator determines the resonant frequency of the resonator, and usually comprises a lower electrode, the piezoelectric layer, and an upper electrode.

That is, the film bulk acoustic resonator (FBAR) device resonates due to the coupling between mechanical stress and load on the piezoelectric layer. The resonant frequency has a length of half an acoustic wave progressing within the device having the same thickness of the stack structure of the resonator comprising the piezoelectric layer and the electrodes. Therefore, the resonant frequency is determined by the total thickness of several layers of the stack structure of the resonator comprising the lower electrode, the piezoelectric layer, and the upper electrode.

The aforementioned film bulk acoustic resonator (FBAR) filter is shaped in a ladder type. The ladder type film bulk acoustic resonator (FBAR) filter is disclosed by "Thin Film Bulk Acoustic Wave Filters for GPS by K. M. Lakin et al. (Lakin), IEEE Ultrasonic Symposium, 1992, pp.471–476". According to this paper, the ladder type film bulk acoustic resonator (FBAR) filter is formed by the composition of the series resonator and the shunt resonator. Each of the series resonator and the shunt resonator has a different center frequency.

Further, the film bulk acoustic resonator (FBAR) device comprises the lower electrode, the piezoelectric layer, and the upper electrode, which are formed on the silicon substrate in order. Herein, an electric field is applied to the upper and the lower electrode, and then a bulk acoustic wave is generated on the piezoelectric layer. In order to maintain the high quality (high-Q), the bulk acoustic wave must be prevented from affecting the silicon substrate. Therefore, in order to prevent the bulk acoustic wave from affecting the silicon substrate, a structure for separating the piezoelectric layer from the silicon substrate is required. Electrical characteristics the film bulk acoustic resonator (FBAR) device such as an insertion loss and a transducer gain, and a practical use of the film bulk acoustic resonator (FBAR) device depend on the aforementioned separation structure. The separation structure is mostly divided into a reflecting layer structure using Bragg reflection and an air-gap structure. The reflecting layer structure is very complicated and takes long time to manufacture. Further, compared to the air-gap structure, the reflecting layer structure deteriorates an insertion loss and reflective characteristics and reduces effective bandwidth. Therefore, the air-gap structure has been used now.

FIG. 2 is a cross-sectional view of the conventional film bulk acoustic resonator (FBAR) device. With reference to FIG. 2, the conventional film bulk acoustic resonator (FBAR) device 20 comprises a piezoelectric layer 22, which is supported by an outer circumference of a well 24 formed on an upper surface of a substrate 26. An upper electrode 28 and a lower electrode 30 are formed on the upper and lower surfaces of the piezoelectric layer 22. The upper electrode 38 and the lower electrode 30 correspond to the well 24. The electrical connection between the upper electrode 38 and the lower electrode 30 is accomplished by an upper terminal 36 and a lower terminal 38. A stack structure 32 of the conventional film bulk acoustic resonator (FBAR) device 20 is formed by the piezoelectric layer 20, the upper electrode 28 and the lower electrode 30. Herein, the stack structure 32 of the film bulk acoustic resonator (FBAR) device 20 expands or contracts in the direction of the arrow 34 according to a direction and a level of a voltage provided between two electrodes 28 and 30.

As described above, in the conventional film bulk acoustic resonator (FBAR) device 20, a center frequency of the resonator depends on the total thickness of the stack structure 32 comprising the piezoelectric layer 20, the upper electrode 28 and the lower electrode 30. Therefore, in order to provide different center frequencies, the thickness of the upper electrode 28 or the lower electrode 30, or the thickness of the piezoelectric layer 20, must be adjusted.

Further, it is difficult to finely control the resonant frequency by the adjustment of the thicknesses of the electrodes or the piezoelectric layer. Moreover, it is not easy to simultaneously manufacture a transmission filter and a reception filter on the same substrate.

SUMMARY OF THE INVENTION

Therefore, the present invention has been made in view of the above problems, and it is an object of the present invention to provide a film bulk acoustic resonator (FBAR) device which comprises a membrane layer having a plurality of active regions and provides different resonant frequencies by providing different thicknesses of the active regions according to series resonators and shunt resonators from each other and by controlling the thicknesses.

It is another object of the present invention to provide a method for fabricating a film bulk acoustic resonator (FBAR) device having a stable structure and excellent characteristics. In this method, a plurality of the film bulk acoustic resonator (FBAR) devices having different resonant frequencies are manufactured on a single substrate, thereby simultaneously manufacturing a transmission filter and a reception filter on the same substrate.

In accordance with one aspect of the present invention, the above and other objects can be accomplished by the provision of a film bulk acoustic resonator (FBAR) device, which is applied to a ladder type filter comprising a plurality of series resonators and a plurality of shunt resonators, comprising: a substrate; an insulating layer formed on the substrate; a membrane support layer being formed on the insulating layer and comprising a plurality of air-gaps; a membrane layer being formed on the membrane support layer and comprising a plurality of active regions to correspond to the air-gaps; a plurality of lower electrodes, each being formed on the active region; a plurality of piezoelectric layers, each being formed on the lower electrode; and a plurality of upper electrodes, each being formed on the piezoelectric layer, wherein a thickness of the active region corresponding to the series resonator differs from a thickness of the active region corresponding to the shunt resonator.

In accordance with another aspect of the present invention, there is provided a film bulk acoustic resonator (FBAR) device, which is applied to a ladder type filter comprising a plurality of series resonators and a plurality of shunt resonators, comprising: a substrate; an insulating layer formed on the substrate; a membrane support layer being formed on the insulating layer and comprising a plurality of air-gaps; a membrane layer being formed on the membrane support layer and comprising a plurality of active regions to correspond to the air-gaps; a plurality of lower electrodes, each being formed on the active region; a plurality of piezoelectric layers, each being formed on the lower electrode; and a plurality of upper electrodes, each being formed on the piezoelectric layer, wherein a thickness of the active region corresponding to the series resonator differs from a thickness of the active region corresponding to the shunt resonator, and center frequencies of the series resonators and the shunt resonators are controlled by adjusting the thicknesses of the active regions of the membrane layer.

In accordance with yet another aspect of the present invention, there is provided a method for fabricating a film bulk acoustic resonator (FBAR) device, which is applied to a ladder type filter comprising a plurality of series resonators and a plurality of shunt resonators, comprising the steps of: (a) preparing a substrate; (b) forming an insulating layer on the substrate; (c) forming a sacrificial layer on the insulating layer; (d) forming a plurality of sacrificial regions for forming air-gaps by selectively removing the sacrificial layer; (e) forming a membrane support layer on the insulating layer with the selectively removed sacrificial layer; (f) forming a membrane layer on the sacrificial regions and the membrane support layer; (g) forming a plurality of active regions on the sacrificial regions of the membrane layer so that a thickness of the active region corresponding to the series resonator differs from a thickness of the active region corresponding to the shunt resonator; (h) forming lower electrodes on the membrane layer including the active regions; (i) forming an piezoelectric layer on the lower electrodes; (j) forming upper electrodes on the piezoelectric layer; and (k) forming the air-gaps by removing the sacrificial regions.

Preferably, in the step (g), the active regions of the membrane layer may be formed in designated thicknesses by etching parts of the membrane layer corresponding to the sacrificial regions.

Further, preferably, the thicknesses of the active regions of the membrane layer may be the same as or less than those of other regions of the membrane layer. Herein, center frequencies of the series resonators and the shunt resonators may be controlled by adjusting the thicknesses of the active regions of the membrane layer.

BRIEF DESCRIPTION OF THE DRAWINGS

The above and other objects, features and other advantages of the present invention will be more clearly understood from the following detailed description taken in conjunction with the accompanying drawings, in which:

FIG. 3b is a cross-sectional view taken along the line A—A' of the filter of FIG. 3a;

DESCRIPTION OF THE PREFERRED EMBODIMENTS

Hereinafter, preferred embodiments of the present invention will be described in detail with reference to the accompanying drawings.

Figure 1A:
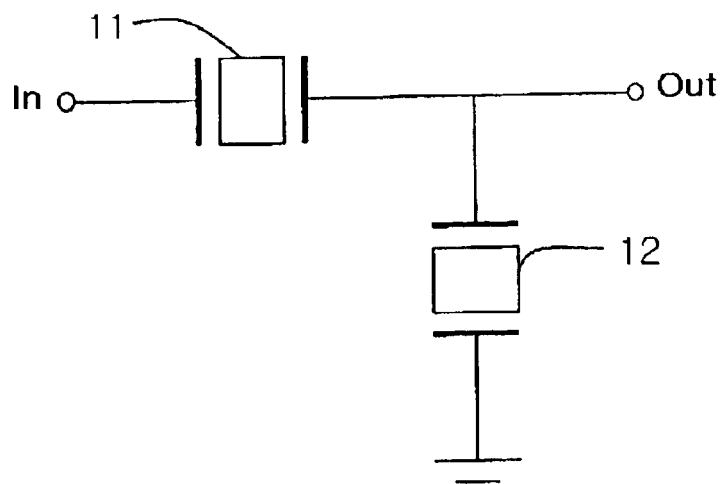
FIG. 1a is a circuit diagram of a conventional film bulk acoustic resonator (FBAR) device for a thin film filter.
Figure 1B:
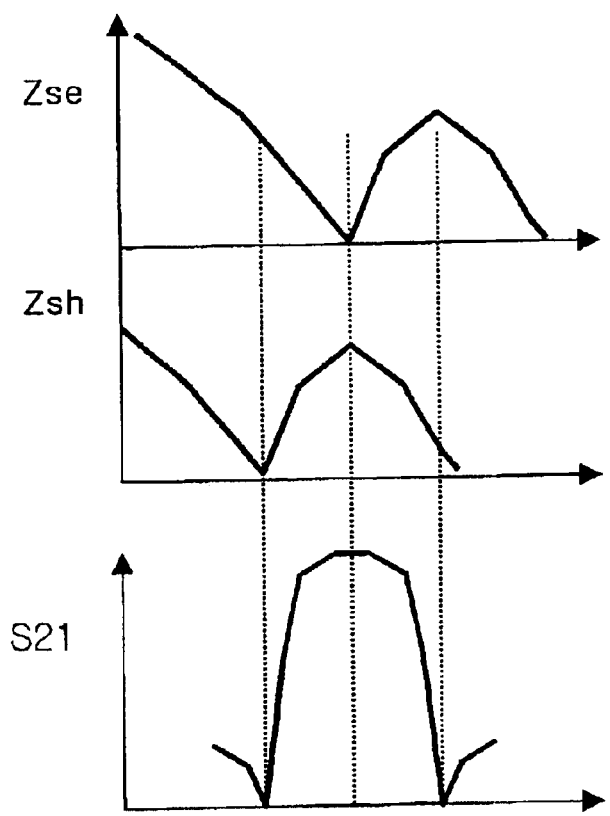
FIG. 1b is a graph of the conventional film bulk acoustic resonator (FBAR) device for the thin film filter.
Figure 2:
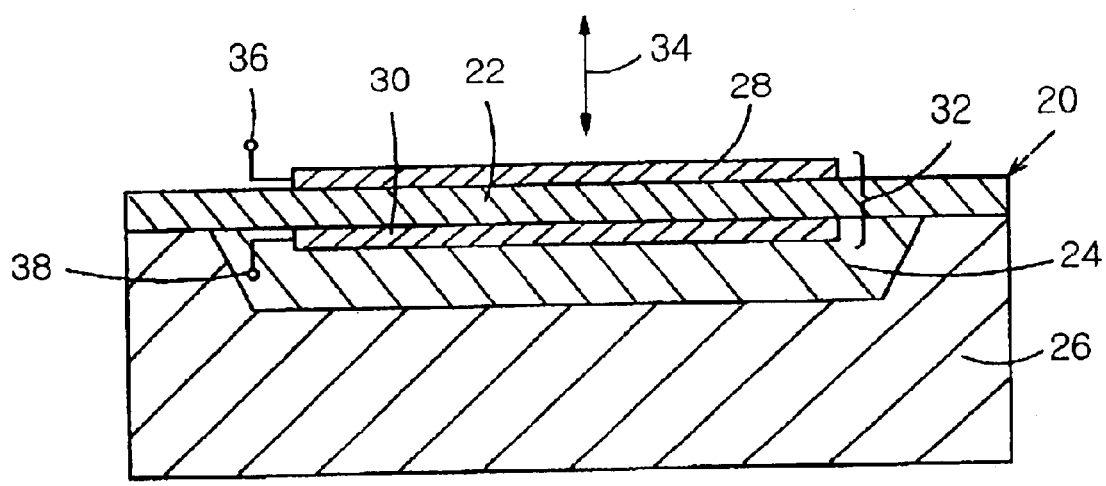
FIG. 2 is a cross-sectional view of the conventional film bulk acoustic resonator (FBAR) device.
Figure 3A:
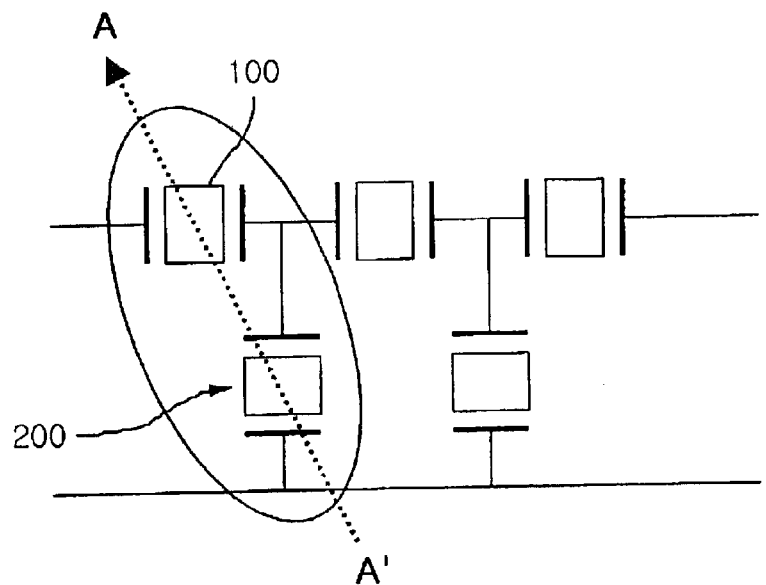
FIG. 3a is a circuit diagram of a filter employing a film bulk acoustic resonator (FBAR) device in accordance with the present invention.
Figure 3B:
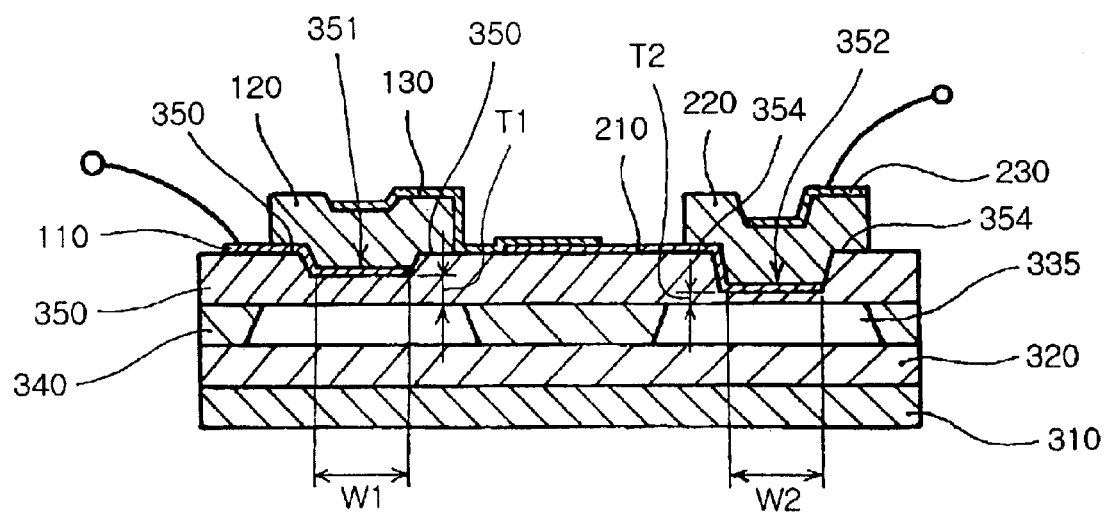

FIG. 3a is a circuit diagram of a filter employing a film bulk acoustic resonator (FBAR) device in accordance with the present invention. FIG. 3b is a cross-sectional view taken along the line A—A' of the filter of FIG. 3a.

With reference to FIG. 3a, the film bulk acoustic resonator (FBAR) of the present invention is employed to a ladder type filter, and comprises a plurality of series resonators 100, which are serially connected to each other, and a plurality of shunt resonators 200, which are disposed between the series resonators 100 and grounded. Herein, the FBAR of the present invention is operated as the series resonators 100 or the shunt resonators 200. A filter is embodied by a combination of the series resonators 100 and the shunt resonators 200.

FIG. 3b is a cross-sectional view taken along the line A—A' of the filter of FIG. 3a comprising a pair of one series resonator 100 and one shunt resonator 200. With reference to FIG. 3b, the film bulk acoustic resonator (FBAR) of the present invention comprises a substrate 310, an insulating layer 320, a membrane support layer 340, membrane layer 350, a plurality of lower electrodes 110 and 210, a plurality of piezoelectric layers 120 and 220, and a plurality of upper electrodes 130 and 230. The insulating layer 320 is formed on the substrate 310. The membrane support layer 340 is formed on the insulating layer 320 and comprises a plurality of air-gaps 335. The membrane layer 350 is formed on the membrane support layer 340 and comprises a plurality of active regions. The active regions of the membrane layer 350 correspond to the air gaps 335 of the membrane support layer 340. The lower electrodes 110 and 210 are formed on the active regions of the membrane layer 350. The piezoelectric layers 120 and 220 are formed on the lower electrodes 110 and 210. The upper electrodes 130 and 230 are formed on the piezoelectric layers 120 and 220.

In order to effectively provide center frequency by comprising the membrane layer 350, the thicknesses Ti and T2 of the active regions of the membrane layer 350 are preferably thinner than that of other regions of the membrane layer 350. More particularly, the thicknesses T1 and T2 of the active regions of the membrane layer 350 is less than 50% of that of other regions of the membrane layer 350. Most preferably, the thicknesses T1 and T2 of the active regions of the membrane layer 350 are in a range of 0.01–1.0 μm.

Particularly, in order to provide different center frequencies of each of the series resonator and the shunt resonator of the film bulk acoustic resonator (FBAR) of the present invention from each other, the thickness T1 of the active region of the membrane layer, which corresponds to the series resonator, and the thickness T2 of the active region of the membrane layer, which corresponds to the shunt resonator, are differently designated.

The upper surface of the active regions of the membrane layer 350 may be subsided. This subsided upper surface of the active regions of the membrane layer 350 is formed by an etching process such as a wet etching or a dry etching.

The center frequencies of the series resonator 100 and the shunt resonator 200 are controlled by adjusting the thicknesses of the active regions of the membrane layer 350. As described above, the thickness T1 of the active region of the membrane layer 350, which corresponds to the series resonator 100 of FIG. 3a, and the thickness T2 of the active region of the membrane layer 350, which corresponds to the shunt resonator 200 of FIG. 3a, are different from each other. Thereby, the film bulk acoustic resonator (FBAR) filter is embodied by the series resonator 100 and the shunt resonator 200, which provide different resonant frequencies.

In case that two FBAR filters are formed on the single substrate, and passband of each FBAR filter is used as a transmission frequency and a reception frequency band, a transmission filter and a reception filter are simultaneously formed on the same substrate.

Further, the present invention provides a method for manufacturing the film bulk acoustic resonator (FBAR) of the embodiment as shown in FIG. 3b. According to the method for manufacturing the film bulk acoustic resonator (FBAR) of the present invention, the thicknesses of the active regions corresponding to each of the series resonator and the shunt resonator are differently formed, thereby forming the filters on the single substrate. The center frequency of the resonator is easily controlled by adjusting the thicknesses of the active regions.

Figure 4A:
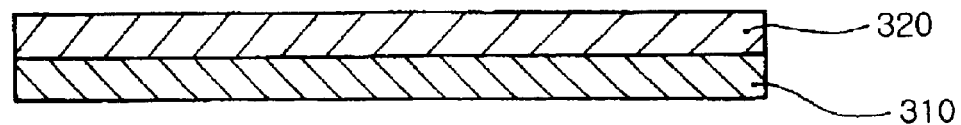
FIGS. 4a through 4i are cross-sectional views illustrating a method for fabricating the film bulk acoustic resonator (FBAR) device in accordance with the present invention.

FIGS. 4a through 4i are cross-sectional views showing respective steps of a method for fabricating the film bulk acoustic resonator (FBAR) in accordance with the present invention. With reference to FIG. 4a, the silicon substrate 310 is prepared (step a), and then the insulating layer 320 is formed on the substrate 310 (step b). Herein, a thermal oxide, which is easily grown on the substrate 310, may be used as the insulating layer 320. Alternatively, an oxide or a nitride, which is formed by a conventional deposition technique such as chemical vapor deposition (CVD), may be optionally used as the insulating layer 320.

Figure 4B:
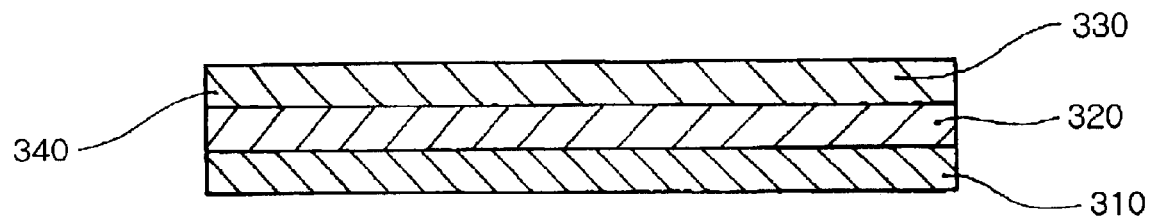
Figure 4C:
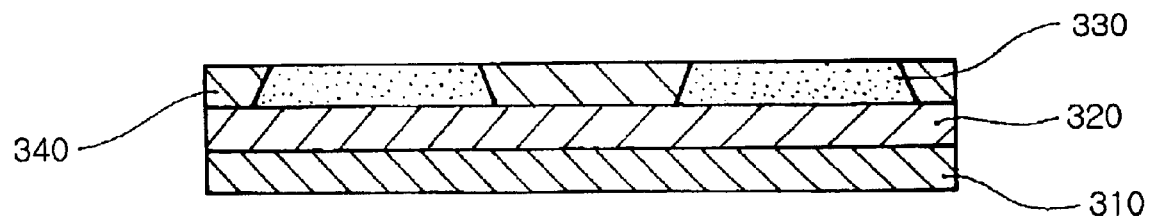
Figure 4D:
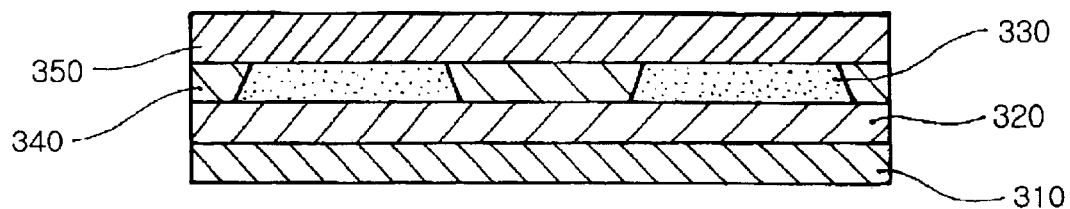

FIGS. 4b to 4d show a process for forming sacrificial regions 330 for forming the air-gaps on the insulating layer 320 of the substrate 310. With reference to FIG. 4b, a sacrificial layer 330 is formed entirely on the upper surface of the insulating layer 320 (step c). Herein, a material which has an excellent roughness and is easily formed and removed, e.g., polysilicon or ZnO is used as the sacrificial layer 330. Then, the sacrificial layer 330 is selectively removed, thereby forming a plurality of the sacrificial regions for forming the air-gaps (step d). In this embodiment of the present invention, polysilicon is used as the sacrificial layer 330 as described above. The polysilicon has an excellent roughness and is easily formed and removed. Particularly, in subsequent steps, the sacrificial layer 330 made of polysilicon is selectively removed by a dry etching process.

As the dry etching of the sacrificial layer 330 is performed, a photoresist layer is coated on the upper surface of the sacrificial layer 330 to correspond to regions for the air-gap regions. The exposed regions of the sacrificial layer 330 from the photoresist layer are removed by the dry etching, thereby forming the sacrificial regions for the air-gaps regions. Then, the coated photoresist layer is removed, thereby completing sacrificial regions.

With reference to FIG. 4c, the membrane support layer 340 is formed on the upper surface of the insulating layer 320, on which sacrificial regions are formed (step e). That is, a photoresist layer is formed entirely on the substrate 310 with the sacrificial regions formed thereon, and insulating material is deposed entirely on the substrate 310. Then, the photoresist is lifted off and removed, thereby forming the membrane support layer 340 as shown in FIG. 4c. Herein, the membrane support layer 340 is made of a material selected from the group consisting of $SiO_2$, SiN or $Al_2O_3$.

With reference to FIG. 4d, the membrane layer 350 is formed on the upper surfaces of the sacrificial regions and the membrane support layer 340 (step f). After forming the membrane support layer 340, the membrane layer 350 is formed on the upper surfaces of the sacrificial regions and the membrane support layer 340. Herein, the membrane layer 350 may be formed by depositing a $SiO_2$ layer in a thickness of 0.01–1.0 μm by CVD. Alternatively, the membrane layer 350 may be deposited by evaporating or sputtering. Further, an oxide such as Si3N4 or Al2O3, or a nitride may be used as the membrane layer 350.

Figure 4E:
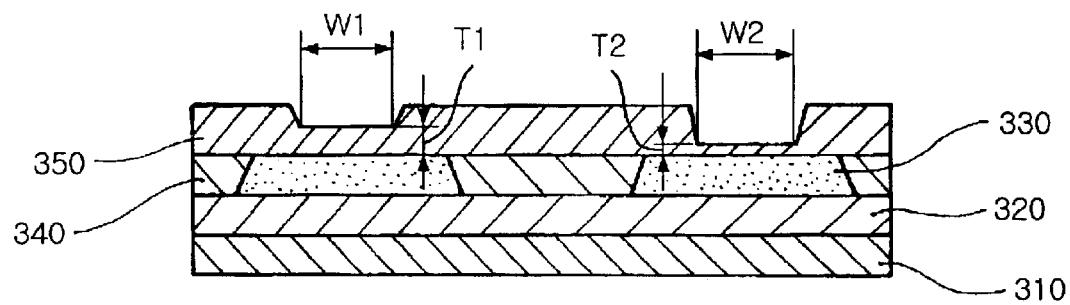

With reference to FIG. 4e, a plurality of the active regions are formed on the upper surface of the membrane layer 350 to correspond to the sacrificial regions (step g). Herein, among plural active regions, the thickness of the active region corresponding to the series resonator of the filter and the thickness of the active region corresponding to the shunt resonator of the filter are different from each other. That is, after forming the membrane layer 350, the regions of the membrane layer 350 corresponding to the sacrificial regions are etched, thereby forming the active regions of the membrane layer 350 so as to have designated thicknesses.

Preferably, the thicknesses of the active regions of the membrane layer 350 are the same as or thinner than that of other regions of the membrane layer 350. The upper surfaces of the active regions are subsided by etching.

Figure 5A:
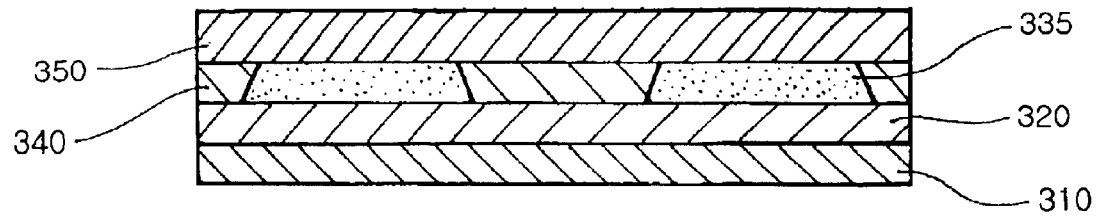
FIGS. 5a through 5d are cross-sectional view showing an etching step of an active region of a membrane layer of FIG. 4d.
Figure 5B:
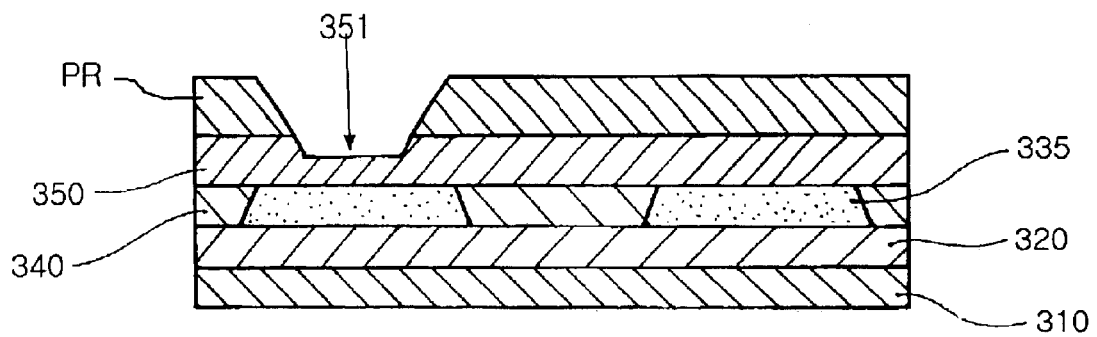
Figure 5C:
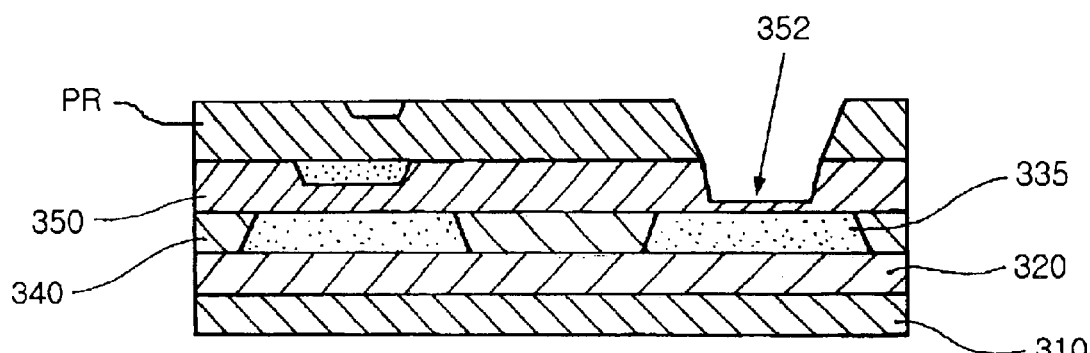
Figure 5D:
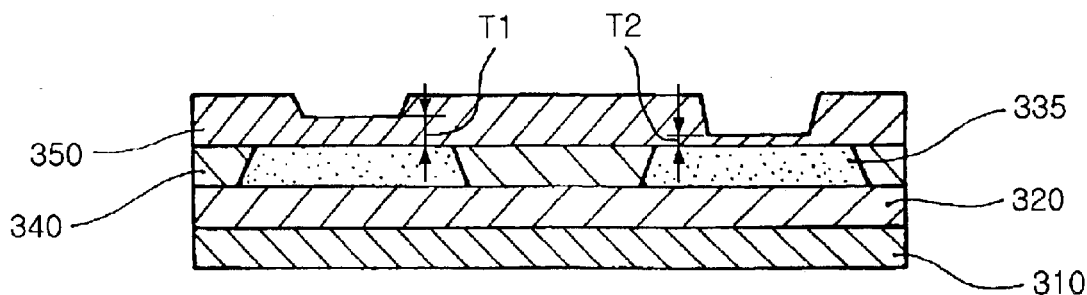

FIGS. 5a through 5c are cross-sectional views showing the etching of the active regions of the membrane layer of FIG. 4d. With reference to FIGS. 5a and 5b, the membrane layer 350 is selectively dry-etched, thereby forming active regions having a thickness of 0.0–1.0 μm. Then, a photoresist (PR) is formed entirely on the substrate 310. As shown in FIG. 5d, the membrane layer 350 is selectively dry-etched, thereby forming active regions of the membrane layer 350 of the series resonator and the shunt resonator. The thicknesses T1 and T2 of the active regions of the membrane layer 350 of the series resonator and the shunt resonator may be different from each other by PR deposition and PR removal steps.

For example, the photoresist (PR) is deposited entirely on the substrate 310. Then the substrate 310 deposited with the photoresist (PR) is hard-baked using a hot plate for 1–20 min at the temperature of 110–200° C. Then, $CF_4$ gas of 10–100 sccm is introduced into the substrate 310, and the substrate 301 is etched for 10–1,000 sec using a reactive ion etching (RIE) equipment. The thicknesses T1 and T2 of the active regions of the membrane layer 350 of the series resonator and the shunt resonator are determined by a kind of the etching equipment, a kind of the etchant, an etching rate, and etching time. Thereby, the thickness of the active region is controlled to a desired level by properly adjusting the kind of the etching equipment, the kind of the etchant, the etching rate, and the etching time. The center frequencies of the series resonator and the shunt resonator may be controlled by adjusting the thicknesses of the active regions of the membrane layer.

The active regions of the membrane layer may be etched by reflective ion etching (RIE), inductively coupled plasma (ICP), or electron cyclotron resonance (ECR) equipments using a single gas of CxFy, $SF_6$, $Cl_2$, $CCl_2F_2$, $XeF_2$, $BrF_2$, $H_2$, $O_2$, or a composition thereof.

The center frequencies of each of the series resonator and the shunt resonator of the film bulk acoustic resonator (FBAR) of the present invention are controlled by differently forming the thicknesses of the active regions of the membrane layer corresponding to the series resonator and the shunt resonator by the etching process. Herein, the center frequency of each of the series resonator and the shunt resonator is determined by total thickness of the resonator stack structure comprising the lower electrodes, the piezoelectric layers, the upper electrodes and the active regions of the membrane layer.

As shown in FIG. 5d, each thickness T1 and T2 of the active regions of the membrane layer of the resonator stack structure comprising the upper and lower electrodes and the piezoelectric layers are differently formed in a range of 0.0–1.0 μm, thereby being capable of fabricating the series resonator and the shunt resonator, having different resonant frequencies. That is, the center frequencies of the series resonator and the shunt resonator may be controlled by a simple fabricating process. Further, a film bulk acoustic resonator (FBAR) filter having a more firm and stable structure can be fabricated by comprising the membrane layer.

Figure 4F:
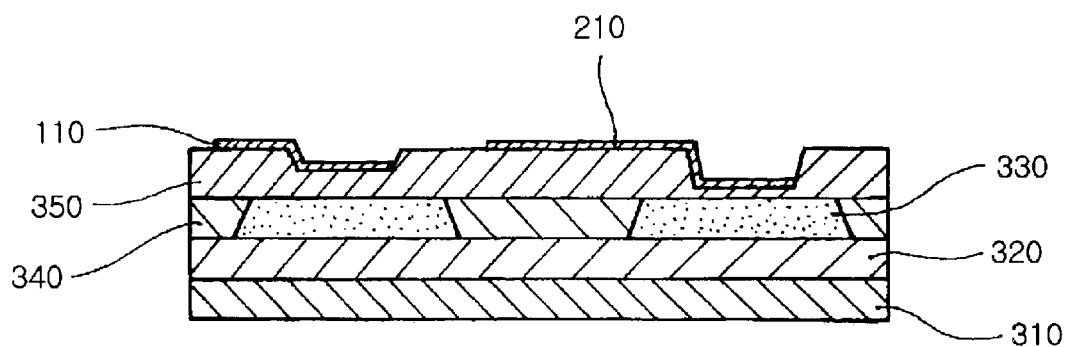
Figure 4G:
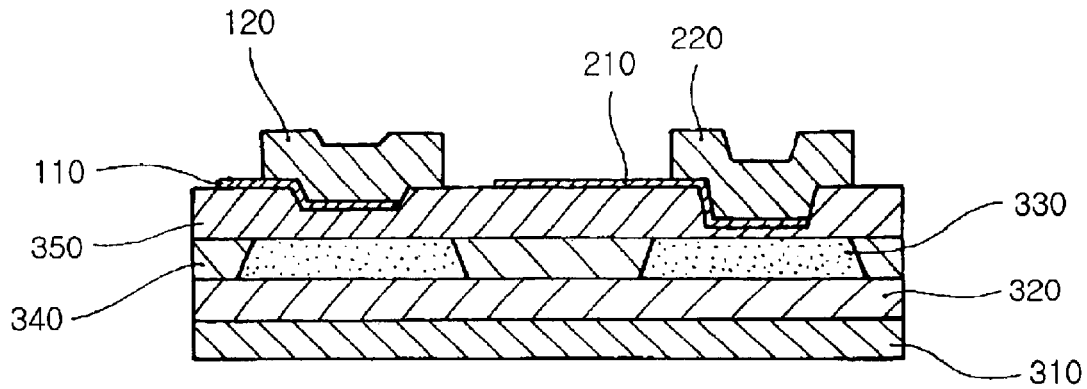
Figure 4H:
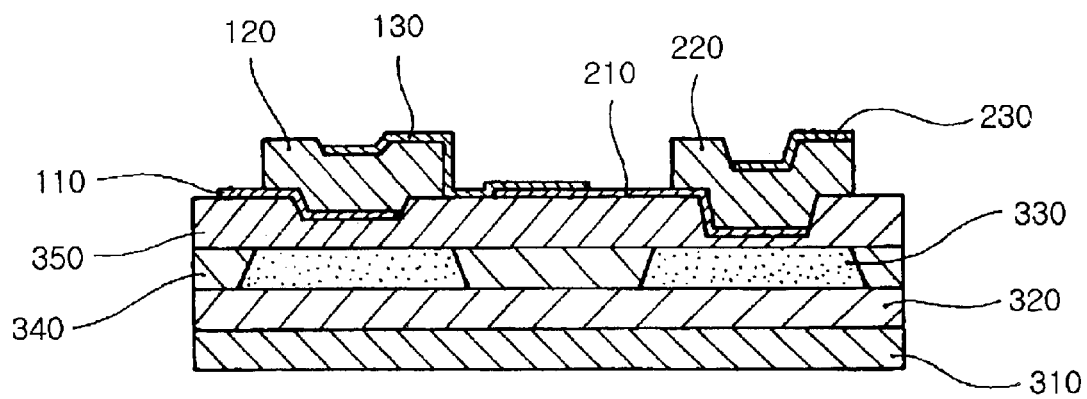

With reference to FIGS. 4f to 4h, the lower electrodes 110 and 210 are formed on the membrane layer 350 including the active regions (step h), and the piezoelectric layers 120 and 220 are formed on the lower electrodes 110 and 210 (step i). Then, the upper electrode 130 and 230 are formed on the piezoelectric layers 120 and 220 (step j).

Herein, material with an excellent conductivity such as Ta, Al, W, Au, Mo, Pt, Ru, or Ti, or a composition layer thereof such as Ta/Au/Mo, Ti/Au/Mo, Ti/Au, Ti/Pi, Ti/W, Ta/W, Cr/W, Ta/Pt, or Ta/Al may be used as the lower electrodes 110 and 120 and the upper electrodes 130 and 230. Further, material with an excellent piezoelectricity such as AIN, PZT including ZnO may be used as the piezoelectric layers 120 and 220.

The center frequency of each filter is controlled using a difference in thicknesses of the upper electrodes 130 and 230 deposited on the piezoelectric layers 120 and 220. Therefore, a filter, which is operated in a wide frequency range of about 100 MHz of a transmission port and a reception port required in manufacturing a duplexer, is fabricated on a single substrate by using a difference between the thicknesses T1 and T2 obtained by etching the active regions of the membrane layer and the thicknesses of the upper electrodes 130 and 230 deposited on the piezoelectric layers 120 and 220.

Figure 4I:
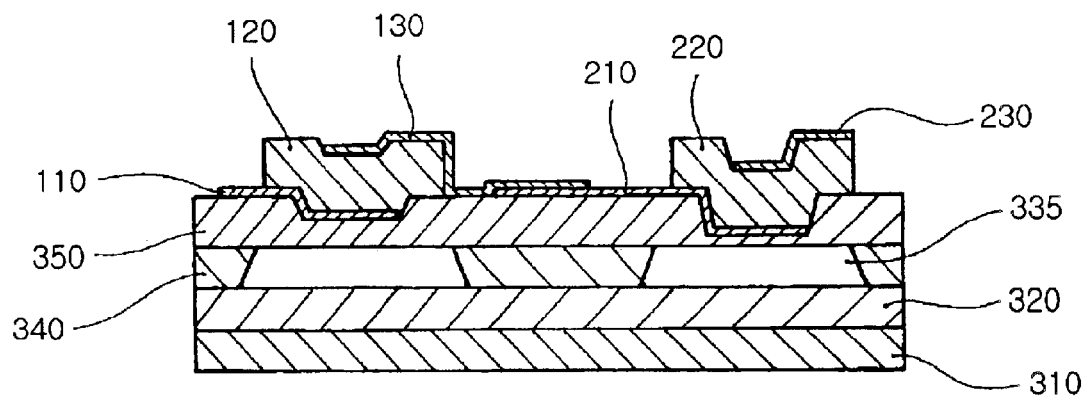

With reference to FIG. 4i, the air-gaps 335 are formed by removing the sacrificial regions (step k). Herein, the sacrificial regions of the sacrificial layer 330 are removed by the wet etching and the dry etching process. The etching type is determined by the material of the sacrificial layer 330. For example, via holes for interconnecting the sacrificial layer 330 to the outside are formed, and an etchant is provided to the sacrificial layer 330 through the via holes. The etchant for removing the sacrificial layer 330 may also etch the piezoelectric layers 120 and 220. Further, the via holes are formed outside the perimeter of the active regions. As described above, after forming the via holes, the sacrificial regions are removed through the via holes, thereby forming the air-gaps 335.

Figure 6:
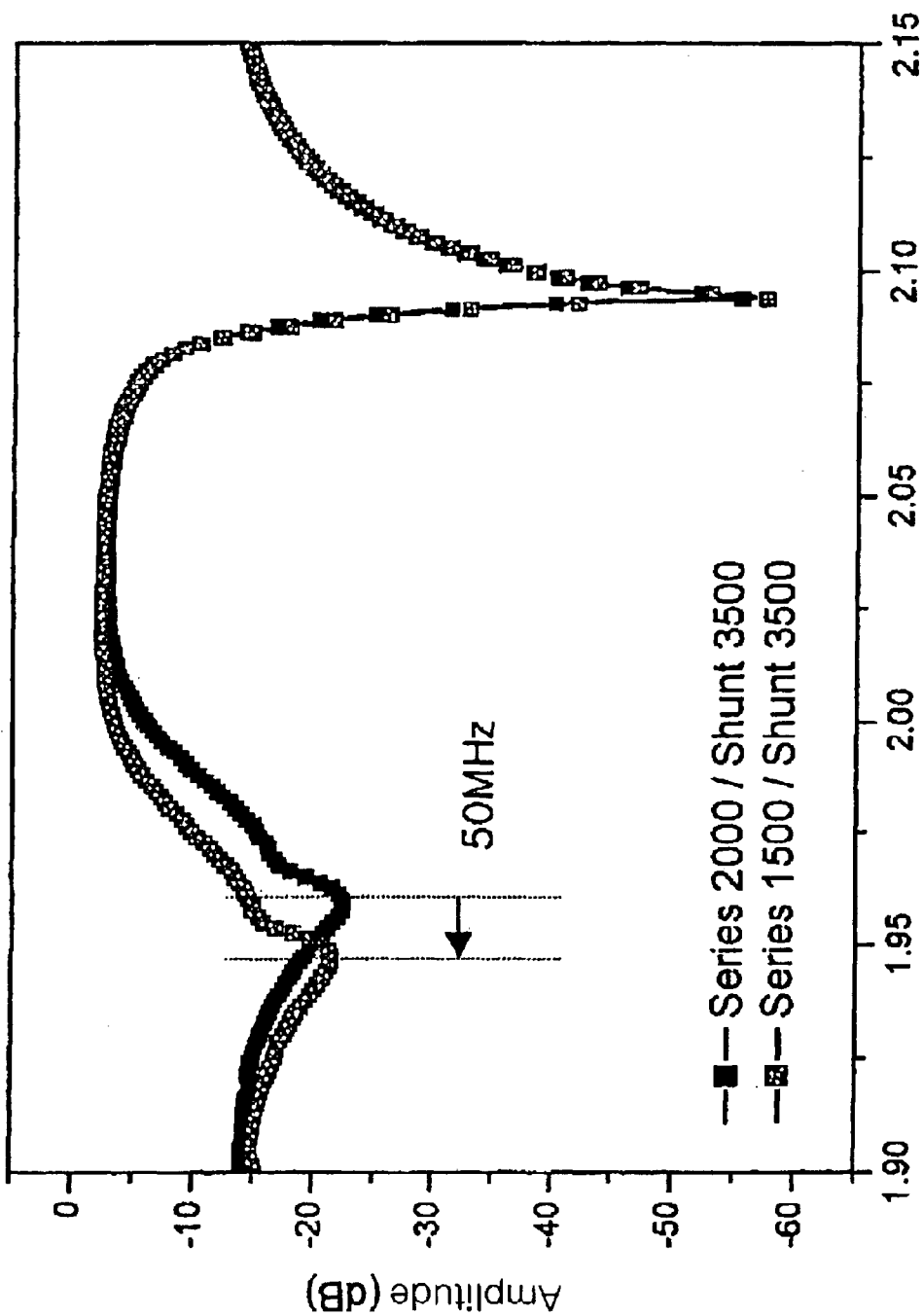
FIG. 6 is a graph showing frequency response of the film bulk acoustic resonator (FBAR) device in accordance with the present invention.

FIG. 6 is a graph showing frequency response of the film bulk acoustic resonator (FBAR) in accordance with the present invention. As shown in FIG. 6, when the thickness of the membrane layer of the film bulk acoustic resonator (FBAR) of the present invention is changed by 100 Å, its resonant frequency is changed by 10 MHz, and when the thickness of the upper electrode of the film bulk acoustic resonator (FBAR) of the present invention is changed by 100 Å, its resonant frequency is changed by 18 MHz. Thereby, the frequency is easily controlled by adjusting the thickness of the membrane layer with less sensitivity rather than the thickness of the upper electrode.

Further, with the film bulk acoustic resonator (FBAR) of the present invention, the transmission filter and the reception filter may be formed on the same substrate. In this case, when the thickness of the membrane layer, the thickness of the lower electrode, the thickness of the piezoelectric layer, and the thickness of the upper electrode are described in the following Table 1, frequency response characteristics as shown in FIG. 7 were obtained.

TABLE 1 unit[Å]

| | Thickness of membrane layer | | Thickness of lower electrode | Thickness of piezoelectric layer | Thickness of upper electrode |
|---|---|---|---|---|---|
| | Series resonator | Shunt resonator | | | |
| Transmission filter | 1,500 | 3,500 | 1,000 | 10,300 | 3,300 |
| Reception filter | 1,500 | 3,500 | 1,000 | 10,300 | 2,100 |

Figure 7:
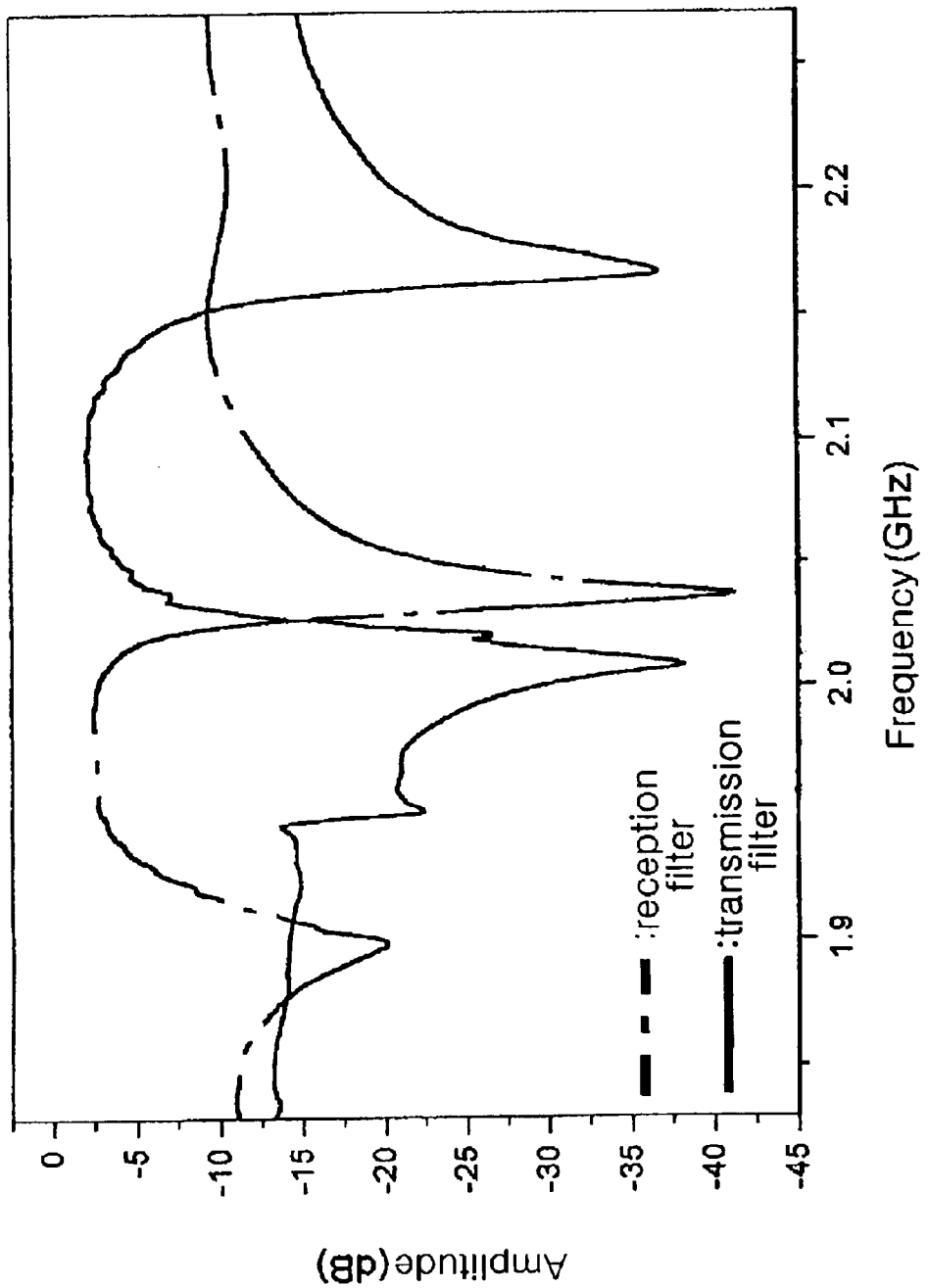
FIG. 7 is a graph showing frequency response of a transmission filter and a reception filter employing the film bulk acoustic resonator (FBAR) device in accordance with the present invention.

FIG. 7 is a graph showing frequency response of the transmission filter and the reception filter employing the film bulk acoustic resonator (FBAR) in accordance with the present invention. With reference to FIG. 7, the film bulk acoustic resonator (FBAR) of the present invention comprising the series resonator and the shunt resonator serves as a filter. The transmission filter and the reception filter may be formed on the same substrate by controlling the thicknesses of the active regions of the membrane layer.

As described above, the film bulk acoustic resonator (FBAR) device comprises a plurality of layers having different thicknesses. Resonant frequency is determined by the thickness of at least one layer out of plural layers. Differing from the conventional case using the difference of the thicknesses between the upper electrodes, the present invention differently etches the active regions of the series resonator and the shunt resonator of the filter, thereby being different thicknesses of the active regions. Therefore, the film bulk acoustic resonator (FBAR) filter can be fabricated by an economical and simple process and the center frequency and the filter can be effectively controlled.

As apparent from the above description, the present invention provides a film bulk acoustic resonator (FBAR) device comprising a membrane layer having a plurality of active regions. Each of the active regions corresponds to the series resonator and the shunt resonator. The thicknesses of the active regions corresponding to the series resonator and the shunt resonator differ from each other. Therefore, the film bulk acoustic resonator (FBAR) device provides different resonant frequencies by providing different thicknesses of the active regions of the series resonator and the shunt resonator, and by controlling the thicknesses, respectively. Thereby, a plurality of the film bulk acoustic resonator (FBAR) devices having different resonant frequencies can be manufactured, and a transmission filter and a reception filter can be simultaneously manufactured on the same substrate. Further, the film bulk acoustic resonator (FBAR) device of the present invention has a stable structure and excellent characteristics.

Moreover, a transmission filter and a reception filter, which are operated in a wide frequency range are fabricated on a single substrate by using the difference between the thicknesses of the etched active regions and the thickness of the upper electrode deposed on the piezoelectric layer. Therefore, the transmission filter and the reception filter, which were conventionally manufactured on different substrates, can be simultaneously manufactured on the same substrate, thereby manufacturing the transmission filter and the reception filter within one single chip.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A film bulk acoustic resonator (FBAR) device, which is applied to a ladder type filter comprising a plurality of series resonators and a plurality of shunt resonators, said FBAR comprising:

a substrate;

an insulating layer formed on the substrate;

a membrane support layer being formed on the insulating layer and comprising a plurality of air-gaps;

a membrane layer being formed on the membrane support layer and comprising a plurality of active regions to correspond to the air-gaps;

a plurality of lower electrodes, each being formed on the active region;

a plurality of piezoelectric layers, each being formed on the lower electrode; and a plurality of upper electrodes, each being formed on the piezoelectric layer, wherein a thickness of the active region corresponding to the series resonator differs from a thickness of the active region corresponding to the shunt resonator.

2. The film bulk acoustic resonator (FBAR) device as set forth in claim 1, wherein the thicknesses of the active regions of the membrane layer are the same as or less than that of other regions of the membrane layer.

3. The film bulk acoustic resonator (FBAR) device as set forth in claim 2, center frequencies of the series resonators and the shunt resonators are controlled by adjusting the thicknesses of the active regions of the membrane layer.

4. The film bulk acoustic resonator (FBAR) device as set forth in claim 2, wherein the thicknesses of the active regions of the membrane layer are in a range of 0.0~1.0 μm.

5. The film bulk acoustic resonator (FBAR) device as set forth in claim 1, wherein the active regions of the membrane layer have subsided upper surfaces.

6. The film bulk acoustic resonator (FBAR) device as set forth in claim 5, wherein said subsided upper surfaces of the active regions are formed by an etching process.

7. A film bulk acoustic resonator (FBAR) device, which is applied to a ladder type filter comprising a plurality of series resonators and a plurality of shunt resonators, said FBAR comprising:

a substrate;

an insulating layer formed on the substrate;

a membrane support layer being formed on the insulating layer and comprising a plurality of air-gaps;

a membrane layer being formed on the membrane support layer and comprising a plurality of active regions to correspond to the air-gaps;

a plurality of lower electrodes, each being formed on the active region;

a plurality of piezoelectric layers, each being formed on the lower electrode; and a plurality of upper electrodes, each being formed on the piezoelectric layer, wherein a thickness of the active region corresponding to the series resonator differs from a thickness of the active region corresponding to the shunt resonator, and center frequencies of the series resonators and the shunt resonators are controlled by adjusting the thicknesses of the active regions of the membrane layer.

* * * * *